(12) United States Patent
Seyed Aliroteh et al.

(10) Patent No.: US 10,879,856 B2
(45) Date of Patent: Dec. 29, 2020

(54) SENSOR ARRAY WITH DISTRIBUTED LOW NOISE AMPLIFIER

(71) Applicant: TEXAS INSTRUMENTS INCORPORATED, Dallas, TX (US)

(72) Inventors: Miaad Seyed Aliroteh, Milpitas, CA (US); Nirmal C. Warke, Saratoga, CA (US); David P. Magee, Allen, TX (US); Ali Kiaei, San Jose, CA (US); Baher S. Haroun, Allen, TX (US); Ajay Singhvi, Stanford, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 36 days.

(21) Appl. No.: 16/232,494

(22) Filed: Dec. 26, 2018

(65) Prior Publication Data

US 2020/0212854 A1    Jul. 2, 2020

(51) Int. Cl.
| | | |
|---|---|---|
| H03F 1/14 | (2006.01) | |
| H03F 3/195 | (2006.01) | |
| G01S 17/10 | (2020.01) | |
| G01S 7/481 | (2006.01) | |
| H03F 3/72 | (2006.01) | |

(52) U.S. Cl.
CPC ........... *H03F 3/195* (2013.01); *G01S 7/4816* (2013.01); *G01S 7/4817* (2013.01); *G01S 17/10* (2013.01); *H03F 3/72* (2013.01); *H03F 2200/294* (2013.01)

(58) Field of Classification Search
CPC ...... H03F 3/195; H03F 2200/294; H03F 3/08; H03F 3/087; H03F 3/082; G01S 7/4816; G01S 7/4817; G01S 17/10
USPC ............................................. 330/51, 59, 308
See application file for complete search history.

(56) References Cited

U.S. PATENT DOCUMENTS

| | | | | | |
|---|---|---|---|---|---|
| 6,130,423 | A | * | 10/2000 | Brehmer ............. | H04N 3/1568 250/208.1 |
| 6,473,122 | B1 | * | 10/2002 | Kanekal ................ | H04N 5/349 348/340 |
| 7,133,074 | B1 | * | 11/2006 | Brehmer ............... | H04N 5/335 348/308 |
| 7,199,349 | B2 | * | 4/2007 | Olsen ................... | H04N 3/1512 250/208.1 |
| 8,153,946 | B2 | * | 4/2012 | Toyoshima ........... | H04N 5/357 250/208.1 |

(Continued)

*Primary Examiner* — Khanh V Nguyen
(74) *Attorney, Agent, or Firm* — Michael A. Davis, Jr.; Charles A. Brill; Frank D. Cimino

(57) ABSTRACT

A sensor circuit includes a sensor array. The sensor array includes a sensor row that includes a first sensor cell, a second sensor cell, and an output stage of a distributed amplifier circuit. The first sensor cell includes a first photodetector, and a first preamplifier stage of the distributed amplifier circuit. The first preamplifier stage is coupled to the first photodetector, and is configured to amplify a signal received from the first photodetector. The second sensor cell includes a second photodetector, and a second preamplifier stage of the distributed amplifier circuit. The second preamplifier stage is coupled to the second photodetector, and is configured to amplify a signal received from the second photodetector. The output stage of the distributed amplifier circuit is coupled to the first and second sensor cells, and is configured to amplify a signal received from the first preamplifier stage and the second preamplifier stage.

19 Claims, 13 Drawing Sheets

(56) References Cited

U.S. PATENT DOCUMENTS

| | | | |
|---|---|---|---|
| 8,598,506 B2* | 12/2013 | Kato | ............... H04N 5/378 |
| | | | 250/214 A |
| 10,318,791 B2* | 6/2019 | He | ............... G02B 6/0026 |
| 2017/0003392 A1 | 1/2017 | Bartlett et al. | |
| 2017/0328988 A1 | 11/2017 | Magee et al. | |
| 2017/0328989 A1 | 11/2017 | Bartlett | |
| 2017/0328990 A1 | 11/2017 | Magee et al. | |
| 2017/0357000 A1 | 12/2017 | Bartlett et al. | |
| 2018/0341020 A1 | 11/2018 | Magee et al. | |

* cited by examiner

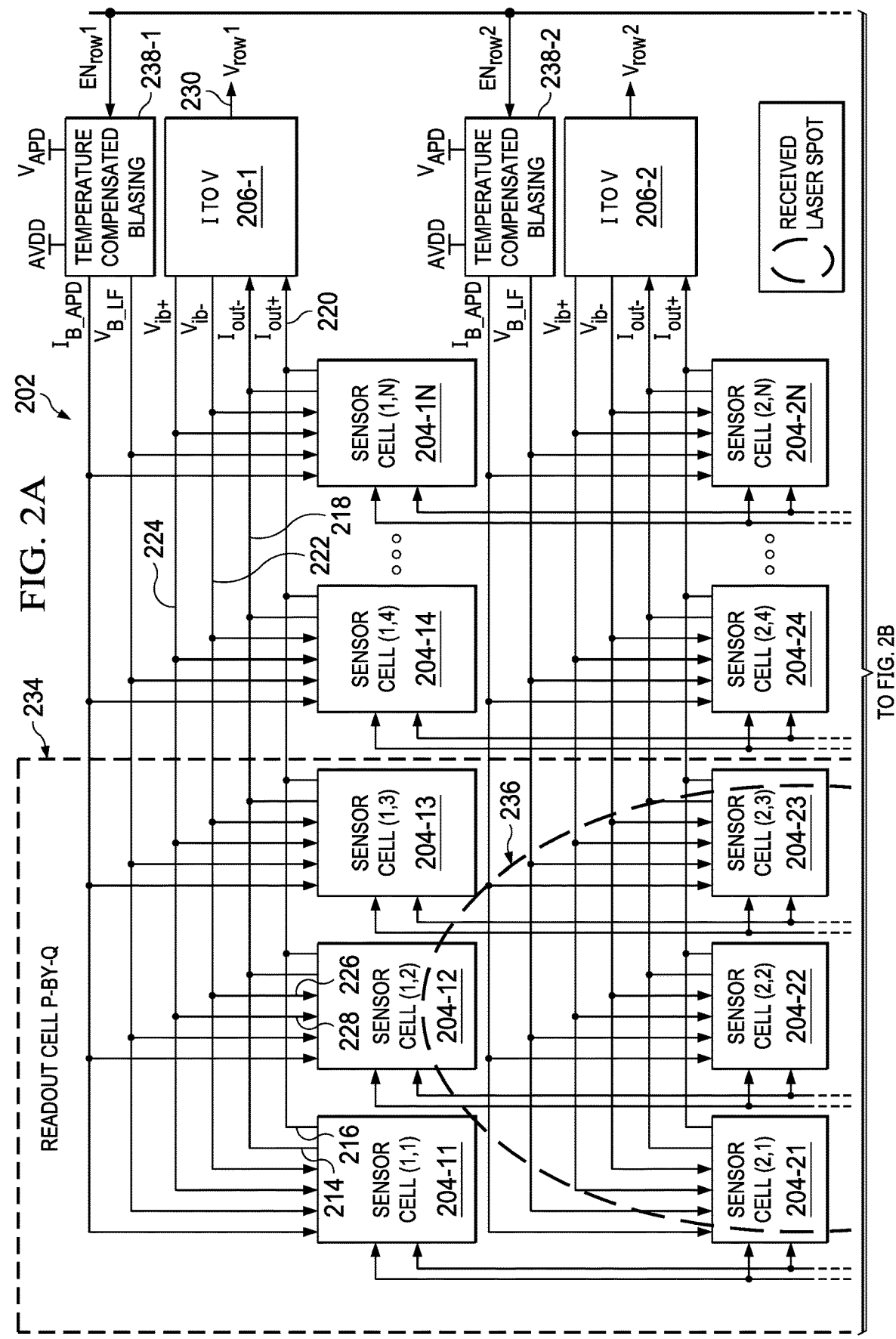

SENSOR ARRAY WITH DISTRIBUTED LOW NOISE AMPLIFIER

BACKGROUND

Optical sensors are used in a number of applications, including vehicle navigation systems, security systems, robotics, and manufacturing automation. Optical sensors generally operate by detecting electromagnetic energy and producing an electrical signal that corresponds to the intensity of the electromagnetic energy incident on the optical sensor. Multiple optical sensors are generally used and are often geometrically arranged in two-dimensional arrays. Such arrays allow a larger spatial area to be scanned than could otherwise be scanned using a single optical sensor.

SUMMARY

An optical sensor circuit that includes distributed low noise amplifiers is disclosed herein. In one example, a sensor circuit includes a sensor array. The sensor array includes a sensor row. The sensor row includes a first sensor cell, a second sensor cell, and an output stage of a distributed amplifier circuit. The first sensor cell includes a first photodetector, and a first preamplifier stage of the distributed amplifier circuit. The first preamplifier stage is coupled to the first photodetector, and is configured to amplify a signal received from the first photodetector. The second sensor cell includes a second photodetector, and a second preamplifier stage of the distributed amplifier circuit. The second preamplifier stage is coupled to the second photodetector, and is configured to amplify a signal received from the second photodetector. The output stage of the distributed amplifier circuit is coupled to the first sensor cell and the second sensor cell, and is configured to amplify a signal received from the first preamplifier stage and the second preamplifier stage.

In another example, an optical scanning system includes a sensor circuit. The sensor circuit includes a sensor array. The sensor array includes a row of sensor cells. The row of sensor cells includes a first sensor cell, a second sensor cell, and an output stage of a distributed amplifier circuit. The first sensor cell includes a first photodetector and a first preamplifier stage of the distributed amplifier circuit, and a first feedback network. The first preamplifier stage is coupled to the first photodetector, and is configured to amplify a signal received from the first photodetector. The first feedback network is coupled to an input of the first preamplifier stage. The second sensor cell includes a second photodetector, a second preamplifier stage of the distributed amplifier circuit, and a second feedback network. The second preamplifier stage is coupled to the second photodetector, and is configured to amplify a signal received from the second photodetector. The second feedback network is coupled to an input of the second preamplifier stage. The output stage of the distributed amplifier circuit is coupled to the first sensor cell and the second sensor cell, and is configured to amplify a signal received from the first preamplifier stage and the second preamplifier stage, and to provide a feedback signal to the first feedback network and the second feedback network.

In a further example, a sensor circuit includes a sensor array. The sensor array includes a sensor row. The sensor row includes a first sensor cell, a second sensor cell, and an output stage of a distributed amplifier circuit. The first sensor cell includes a first photodiode and a first preamplifier stage of the distributed amplifier circuit. The first preamplifier stage of the distributed amplifier circuit includes a first preamplifier and a first global feedback network. The first preamplifier is coupled to the first photodiode. The first preamplifier includes a first transconductance amplifier, and a first local feedback network that couples an input of the first transconductance amplifier to an output of the first transconductance amplifier. The first global feedback network is coupled to an input of the first transconductance amplifier. The second sensor cell includes a second photodiode and a second preamplifier stage of the distributed amplifier circuit. The second preamplifier stage of the distributed amplifier circuit includes a second preamplifier coupled to the second photodiode. The second preamplifier includes a second transconductance amplifier and a second local feedback network that couples an input of the second transconductance amplifier to an output of the second transconductance amplifier. The second global feedback network is coupled to an input of the second transconductance amplifier. The output stage of the distributed amplifier circuit is coupled to the first sensor cell and the second sensor cell. The output stage of the distributed amplifier circuit includes a transimpedance amplifier, a voltage amplifier, and driver circuitry. The transimpedance amplifier is coupled to an output of the first transconductance amplifier and an output of the second transconductance amplifier. The voltage amplifier is coupled to an output of the transimpedance amplifier. The driver circuitry is coupled to the output of the transimpedance amplifier and to an input of the first global feedback network and to an input of the second global feedback network.

BRIEF DESCRIPTION OF THE DRAWINGS

For a detailed description of various examples, reference will now be made to the accompanying drawings in which:

FIGS. 2A, 2B, and 2C show a block diagram for an example of an optical sensor array that includes distributed amplifiers in accordance with this description;

DETAILED DESCRIPTION

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

While applications employing three-dimensional optical imaging are increasing, the available optical sensing solutions suffer from a variety of undesirable limitations. Mechanically scanned sensors are expensive and provide low vertical resolution. Micro-mechanically scanned sensors can be slow. Flash illumination based systems may be limited in range by peak illumination power and low photodetector sensitivity.

The optical sensor circuits disclosed herein provide high vertical and horizontal resolution that is scalable for a variety of applications. For two-dimensional sensing, the sensor circuits include a large array of sensors (e.g., 400× 800) to enable high resolution and fast frame rates. The sensor array may include avalanche photodiodes that are integrated with low-noise analog front end circuitry to eliminate the parasitic capacitance associated with separate packaging and inter-package connections. The analog front end circuitry includes spatially distributed low noise amplifiers. Each sensor cell includes a photodiode and a first stage of a distributed amplifier (i.e., a preamplifier). A second stage of the distributed amplifier is spatially separated from the first stage. For example, the second stage of the distributed amplifier may be located at the outer boundary of the sensor array. The distributed amplifier enables implementations of the optical sensor circuit to provide the high sensitivity needed for applications such as automotive light detection and ranging (LiDAR).

Figure 1:
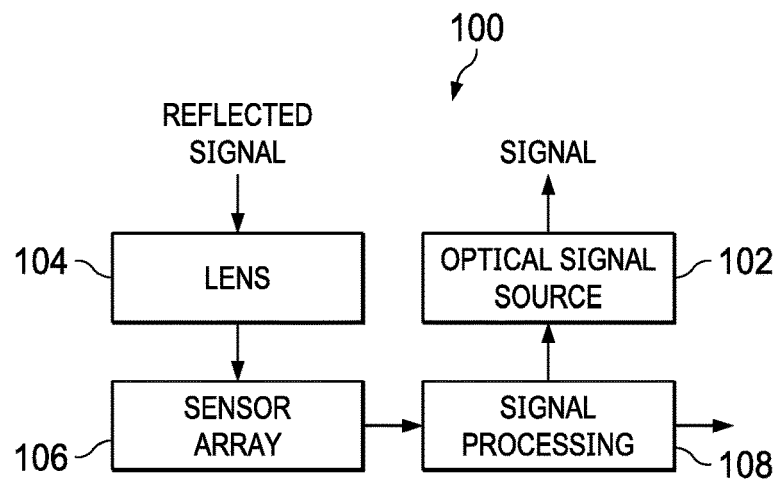
FIG. 1 shows a block diagram for an example of an optical scanning system in accordance with this description.

FIG. 1 shows a block diagram for an example of an optical scanning system 100 in accordance with this description. The optical scanning system 100 includes an optical signal source 102, a lens 104, a sensor array 106, and signal processing circuitry 108. Implementations of the optical scanning system 100 may be applied in automotive LiDAR or other optical scanning applications. The optical signal source 102 may be a laser generator that includes a driver circuit and a laser diode, or other optical signal generation circuitry. Optical signals produced by the optical signal source 102 are reflected by objects being scanned by the optical scanning system 100, and the reflected optical signals are focused, by the lens 104, on the sensor array 106. The sensor array 106 detects and converts the reflected optical signals to electrical signals that are provided to the signal processing circuitry 108.

The signal processing circuitry 108 processes the electrical signals received from the sensor array 106 to generate a three-dimension point cloud representing the environment scanned by the optical scanning system 100. The signal processing circuitry 108 may include amplifiers, filters, analog-to-digital converters, digital processing circuitry, and other components and systems to process the signals received from the sensor array 106. In some implementations of the optical scanning system 100, the sensor array 106 and the signal processing circuitry 108 may be provided on a same integrated circuit.

The sensor array 106 includes an array of sensor cells that detect the reflected optical signals. The array of sensor cells includes a spatially distributed low-noise amplifier that increases detection sensitivity without substantially increasing circuit area. The distributed amplifier includes a first stage that is located within each sensor cell, and a second stage that spatially separated from the sensor cells.

Figure 2B:
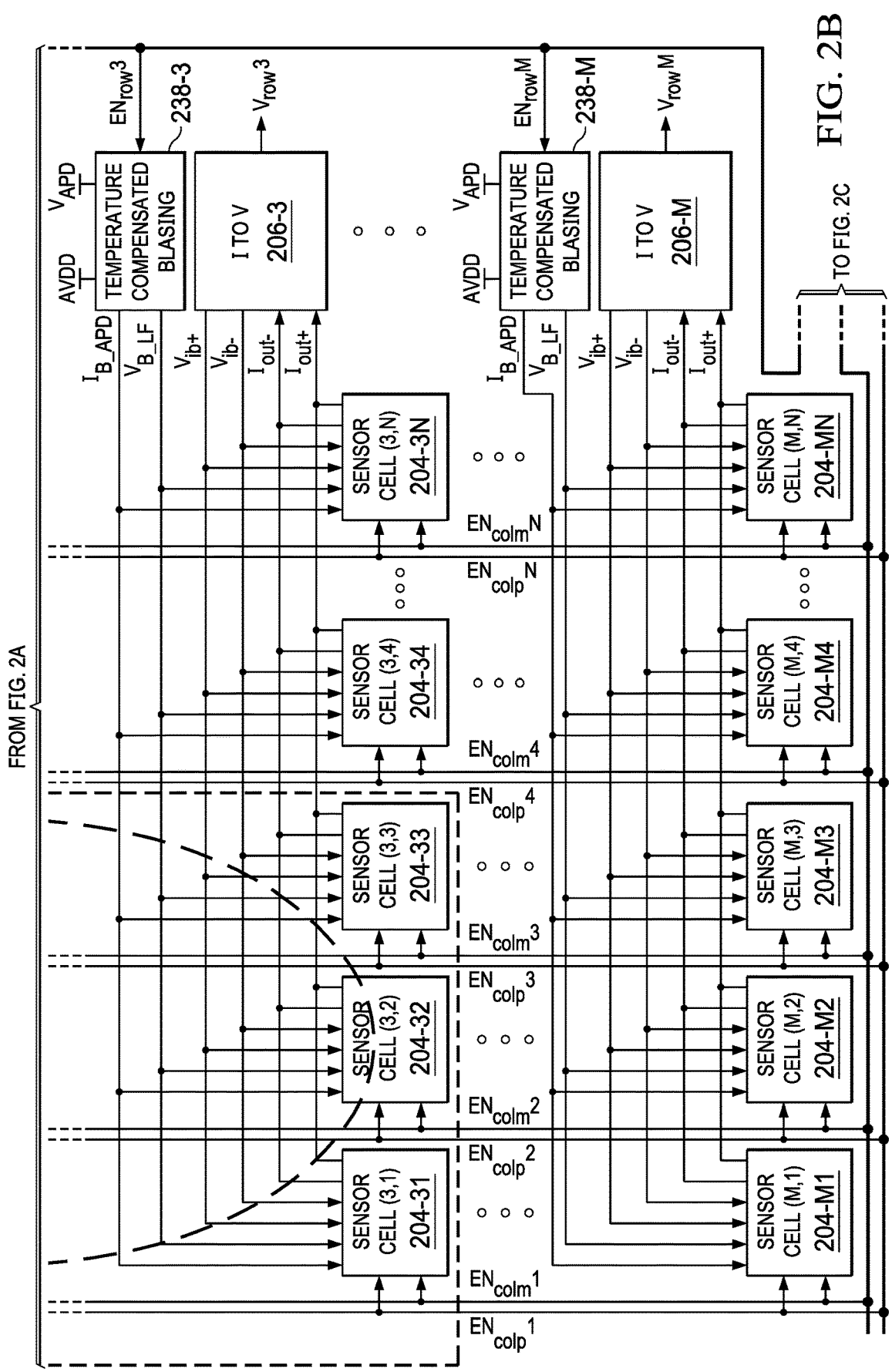
Figure 2C:
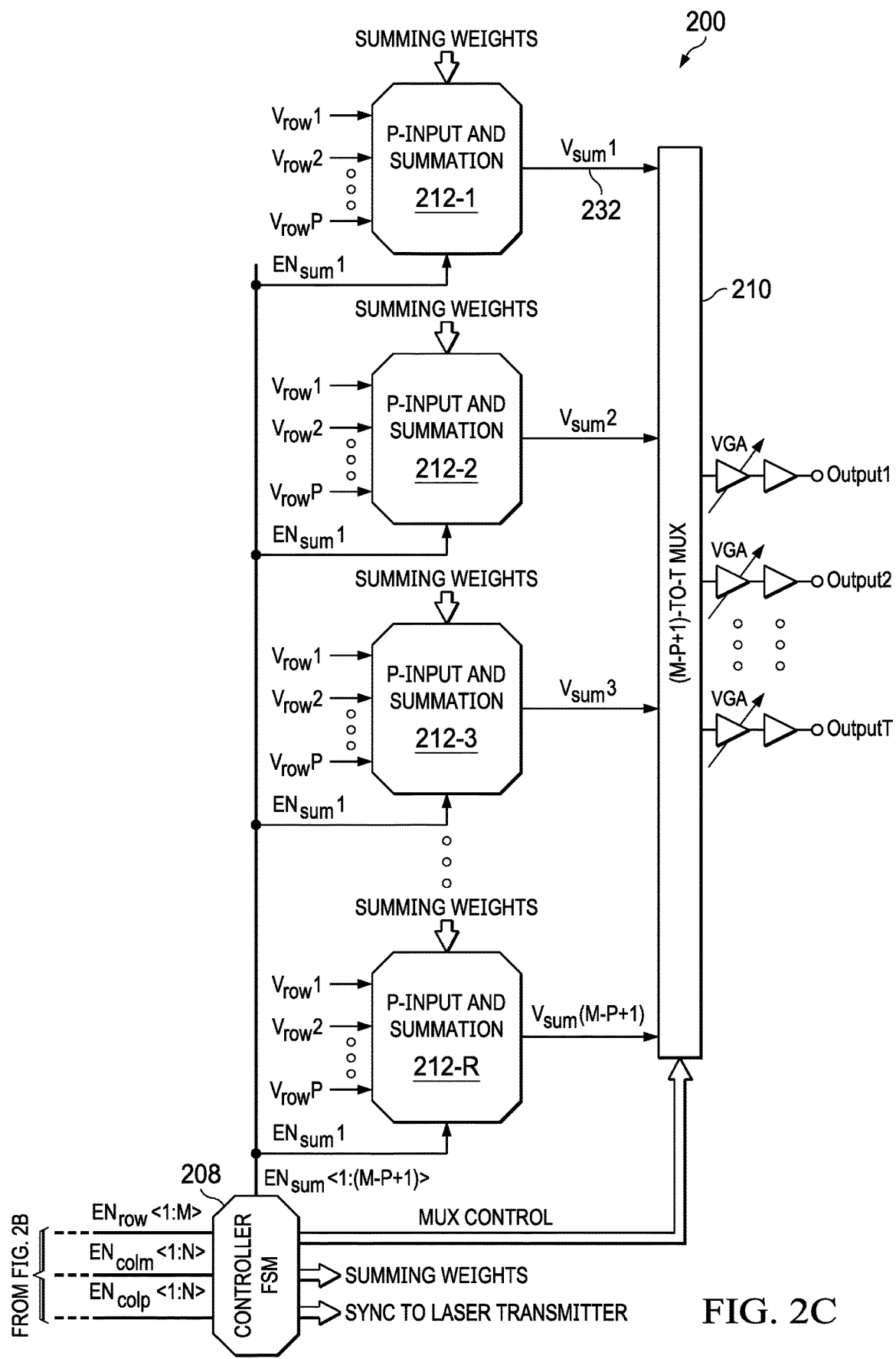

FIGS. 2A, 2B, and 2C show a block diagram for an example of an optical sensor circuit 200 that includes distributed amplifiers in accordance with this description. The optical sensor circuit 200 is an implementation of the sensor array 106. The optical sensor circuit 200 includes a sensor array 202. The sensor array 202 includes sensor cells arranged as M rows and N columns (e.g., M=400 and N=800). In the sensor array 202, each sensor cell is identified by a reference designator "204-MN," where M and N respectively identify the row and column in which the sensor cell is located. Thus, a first row of sensor cells includes sensor cells 204-11, 204-12, 204-13, 204-14, and 204-1N. A second row of sensor cells includes sensor cells 204-21, 204-22, 204-23, 204-24, and 204-2N. A third row of sensor cells includes sensor cells 204-31, 204-32, 204-33, 204-34, and 204-3N. An Mth row of sensor cells includes sensor cells 204-M1, 204-M2, 204-M3, 204-M4, and 204-MN. Any of the sensor cells of the sensor array 202 may individually or collectively be referred to herein as sensor cell(s) 204.

Multiple sensor cells 204 of each row are coupled to a current-to-voltage conversion circuit. In the optical sensor circuit 200, all of the sensor cells 204 of a row are coupled to single current-to-voltage conversion circuit. The sensor cells 204 of row 1 are coupled to the current-to-voltage conversion circuit 206-1. The sensor cells 204 of row 2 are coupled to the current-to-voltage conversion circuit 206-2. The sensor cells 204 of row 3 are coupled to the current-to-voltage conversion circuit 206-3. The sensor cells 204 of row M are coupled to the current-to-voltage conversion circuit 206-M. Any of the current-to-voltage conversion circuits of the optical sensor circuit 200 may individually or collectively be referred to herein as current-to-voltage conversion circuit(s) 206. In some embodiments of the optical sensor circuit 200, an instance of the current-to-voltage conversion circuit 206 may be coupled to a subset of the sensor cells 204 of a row.

Each of the sensor cells 204 includes an output 214 and an output 216. In a row, the outputs 214 of the sensor cells 204 are connected and provided to an input 218 of the current-to-voltage conversion circuit 206. Similarly, the outputs 216 of the sensor cells 204 are connected and provided to an input 220 of the current-to-voltage conversion circuit 206. The current-to-voltage conversion circuit 206 converts the difference of the current flowing in the input 218 and the current flowing in the input 220 to a voltage that is provided at the output 230 of the current-to-voltage conversion circuit 206. Each of the current-to-voltage conversion circuits 206 also includes an output 222 and an output 224. In a row, the output 222 of the current-to-voltage conversion circuit 206 is provided to an input 226 of each of the sensor cells 204. Similarly, the output 224 of the current-to-voltage conversion circuit 206 is provided to an input 228 of each of the sensor cells 204 of the row.

The sensor cells 204 of each row are also coupled to a bias circuit that generates bias voltage and bias current for the sensor cells 204. The sensor cells 204 of row 1 are coupled to the bias circuit 238-1. The sensor cells 204 of row 2 are coupled to the bias circuit 238-2. The sensor cells 204 of row 3 are coupled to the bias circuit 238-3. The sensor cells 204 of row M are coupled to the bias circuit 238-M. Any of the bias circuits of the optical sensor circuit 200 may individually or collectively be referred to herein as bias circuit(s) 238.

The output 230 of each of the current-to-voltage conversion circuits 206 is coupled to a plurality of summation circuits. FIG. 2C shows summation circuit 212-1, summation circuit 212-2, summation circuit 212-3, and summation circuit 212-R. In some implementations of the optical sensor circuit 200 R is equal to M-P+1, where P is the number of outputs 230 summed by the summation circuit 212. Any of the summation circuits of the optical sensor circuit 200 may individually or collectively be referred to herein as summation circuit(s) 212. The summation circuit 212 may include amplifiers and variable weighting circuitry to produce a weighted sum of the voltage signals provided by the current-to-voltage conversion circuit 206 coupled to the summation circuit 212.

Each of the summation circuits 212 includes an output 232. The output 232 of each of the summation circuits 212 is coupled to a multiplexer 210. The multiplexer 210 routes the outputs 232 of the summation circuits 212 to the outputs of the optical sensor circuit 200.

The optical sensor circuit 200 includes a control circuit 208 that is coupled to and provides control signals to the multiplexer 210, each of the summation circuits 212, each of the bias circuits 238 and each of the sensor cells 204. The control circuit 208 is also coupled to the optical signal source 102 to control the timing of optical signal generation. The control circuit 208 may include a state machine circuit in some implementations. The control circuit 208 controls read out of the sensor array 202. The control circuit 208 is programmable to allow the sensor cells 204 to be read in any combination and any sequence. The control circuit 208 provides control signals to the multiplexer 210 that select the routing of outputs of the summation circuits 212 to the outputs of the optical sensor circuit 200. The control circuit 208 provides control signals to the summation circuits 212 that set the summation weights applied to the voltage signals received from the current-to-voltage conversion circuits 206, and activate the summation circuits 212 needed to sum the outputs of the current-to-voltage conversion circuits 206 corresponding to incidence of laser light. The number of summation circuits 212 activated may correspond to the number of laser spots expected on the sensor array 202 at a given time. The control circuit 208 provides control signals to each of the bias circuits 238 that enable or disable bias voltage or bias current output. The control circuit 208 provides control signals to the sensor cells 204 that enable or disable the outputs of the sensor cells 204, and that enable or disable the inputs of the sensor cells 204.

Figure 3:
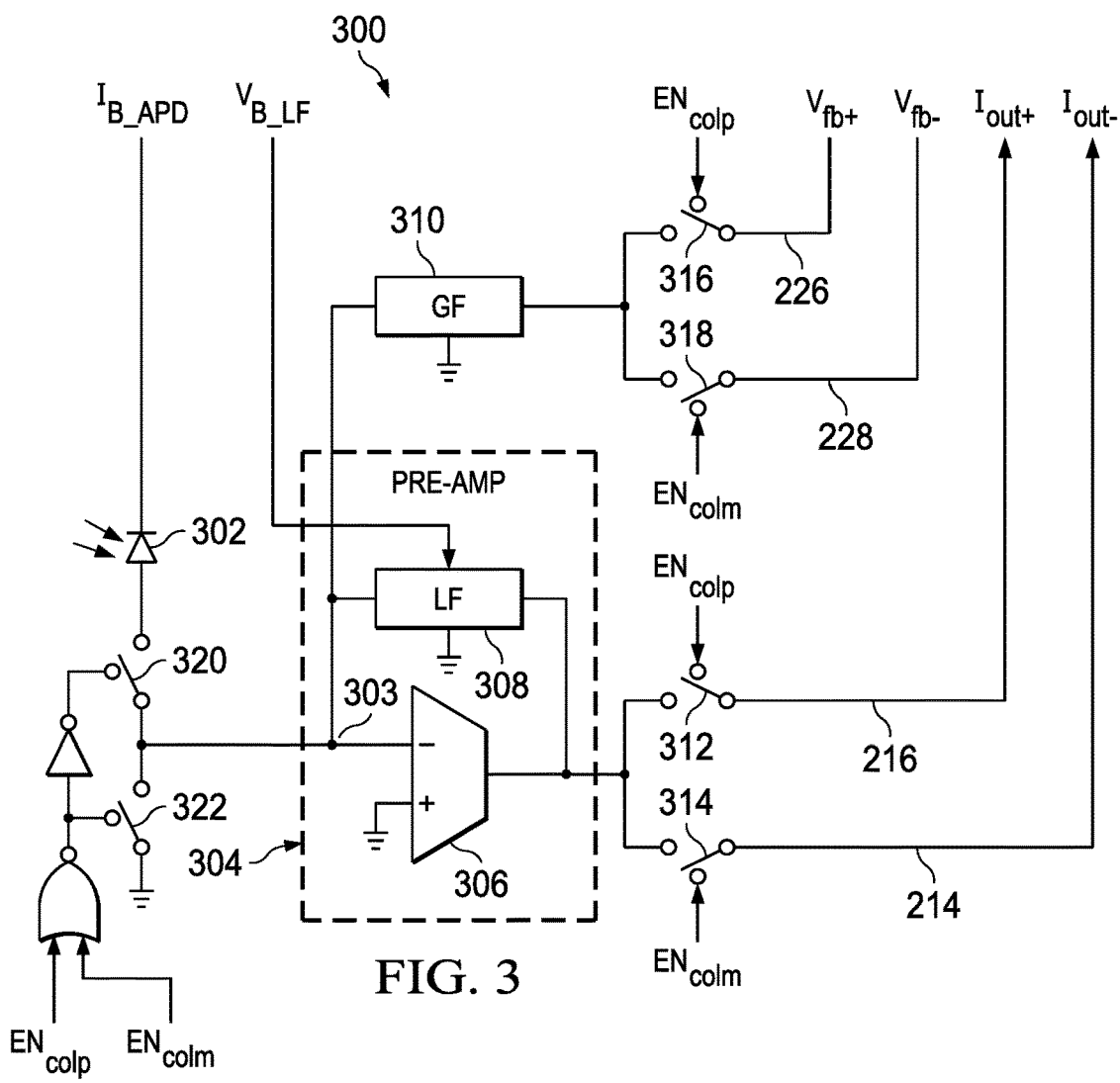
FIG. 3 shows a schematic diagram for an example of an optical sensor cell that includes a first stage of a distributed amplifier in accordance with this description.

FIG. 3 shows a schematic diagram for an example of an optical sensor cell 300 that includes a first stage of a distributed amplifier in accordance with this description. The optical sensor cell 300 is an implementation of the sensor cell 204. The optical sensor cell 300 includes a photodiode 302, a preamplifier circuit 304, a global feedback network 310, a switch 312, a switch 314, a switch 316, a switch 318, a switch 320, and a switch 322. Some implementations of the optical sensor cell 300 may omit some of the components shown in FIG. 3. For example, an implementation of the optical sensor cell 300 may omit one or more of the switches 312 to 322. The photodiode 302 may be PIN photodiode or an avalanche photodiode. The photodiode 302 is biased by current received from the bias circuit 238. An anode of the photodiode 302 is coupled to the preamplifier circuit 304 and the global feedback network 310.

The preamplifier circuit 304 is the first stage of the distributed amplifier that includes the preamplifier circuit 304 and the current-to-voltage conversion circuit 206. The preamplifier circuit 304 includes a transconductor 306 (also referred to as a transconductance amplifier 306) and a local feedback network 308. The transconductor 306 converts an input voltage provided by the photodiode 302 into an output current. The local feedback network 308 couples the output of the transconductor 306 to an input of the transconductor 306. The local feedback network 308 may include passive elements (such as resistors, capacitors, inductors) and/or active or nonlinear elements such as transistors.

Figure 4:
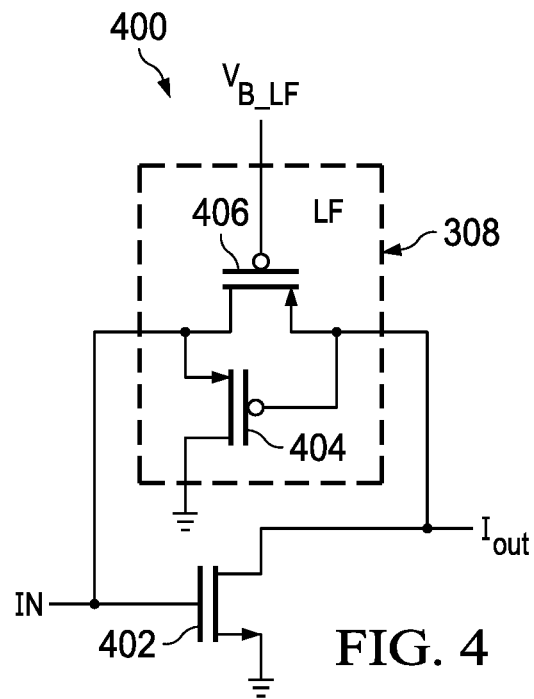
FIG. 4 shows a schematic diagram for an example circuit for the first stage of a distributed amplifier in accordance with this description.

FIG. 4 shows a schematic diagram for an example circuit 400 for the first stage of a distributed amplifier in accordance with this description. The circuit 400 is an implementation of the preamplifier circuit 304. The circuit 400 includes a transistor 402 that implements the transconductor 306, and a transistor 404 and a transistor 406 that implement the local feedback network 308. The transistor 406 is biased with the common-bus biasing voltage, $V_{B\_LF}$ provided by the bias circuit 238, in order to look like a very large resistor between the input and output of the transistor 402 while only consuming a very small area on-chip. This design serves to properly self-bias the circuit 400 for operation when powered on by the DC bias current supplied to the transistor 402 through the output of the circuit 400. The transistor 404 leaks input current into ground only if there is a larger than expected voltage deviation on the output of the transistor 402, due to very strong inputs. This topology serves as a soft gain compression and output saturation.

Returning now to FIG. 3, the output of the preamplifier circuit 304 (i.e., the output of the transconductor 306) is coupled to the switch 312 and the switch 314. The switch 312 selectively couples the output of the preamplifier circuit 304 to the output 216, and the switch 314 selectively coupled the output of the preamplifier circuit 304 to the output 214. Across a row of the sensor array 202, output currents of the preamplifier circuit 304 switched by the switch 312 onto the output 216 are summed on the conductor connecting the output 216 to the current-to-voltage conversion circuit 206, and the output currents of the preamplifier circuit 304 switched by the switch 314 onto the output 214 are summed on the conductor connecting the output 214 to the current-to-voltage conversion circuit 206. Thus, in the optical sensor circuit 200, summation of signal output of multiple sensor cells 204 is provided by connecting the sensor cells 204 via the switch 312 or the switch 314.

The global feedback network 310 couples the current-to-voltage conversion circuit 206 to an input of the transconductor 306. The global feedback network 310 receives feedback signals from the current-to-voltage conversion circuit 206 via the switch 316 and the switch 318. The switch 316 and the switch 318 may operate in conjunction with the switch 312 and the switch 314. That is, the switch 316 is closed if the switch 312 is closed, and the switch 318 is closed if the switch 314 is closed. Closing the switch 316 provides a feedback signal sourced at the output 222 of the current-to-voltage conversion circuit 206 to the global feedback network 310, and closing the switch 318 provides a feedback signal sourced at the output 224 of the current-tovoltage conversion circuit 206 to the global feedback network 310. The global feedback network 310 may include passive elements (such as resistors, capacitors, inductors) and/or active or nonlinear elements such as transistors.

Figure 5:
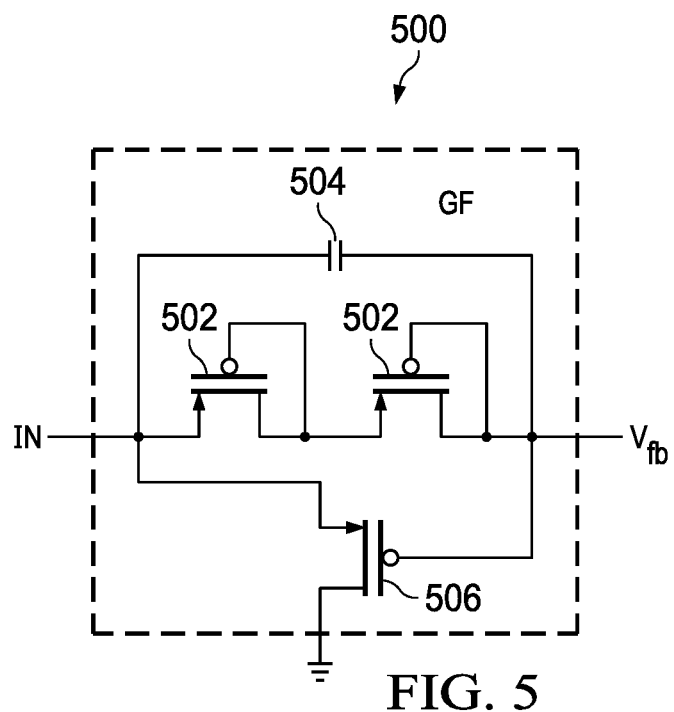
FIG. 5 shows a schematic diagram for an example global feedback circuit of a sensor cell in accordance with this description.

FIG. 5 shows a schematic diagram for an example global feedback circuit 500. The global feedback circuit 500 is an implementation of the global feedback network 310. The global feedback circuit 500 includes two paths. The first path connects feedback signal $V_{fb+}$ (or $V_{fb-}$) to the input of the transconductor 306 via one or more diode-connected transistors 502 in series. A capacitor 504 may be connected in parallel with the transistor(s) 502 in some implementations. This path defines the final gain of the spatially distributed amplifier, which can be well controlled and matched across all cells by biasing the transistors 502 to have a very large series resistance so that the well-controlled capacitance dominates the path's impedance. The second path includes a transistor 506 connecting the input to the ground, and is only activated if there is a larger than expected voltage deviation on the feedback signals, due to very strong inputs. This topology serves as an additional soft gain compression and output saturation technique.

Returning again to FIG. 3, the switch 320 and the switch 322 are provided in some implementations of the optical sensor cell 300 to connect or disconnect the photodiode 302 and the preamplifier circuit 304. The switch 320 is closed to connect the photodiode 302 to the preamplifier circuit 304. If the switch 320 is open, the switch 322 is closed to connect the input of the preamplifier circuit 304 to ground. The switch 312, the switch 314, the switch 316, the switch 318, the switch 320, and the switch 322 are controlled by control signals provided by the control circuit 208.

Referring back to FIG. 2C, in operation of the optical sensor circuit 200, the control circuit 208 may read out the sensor cells 204 as read-cells that include a two-dimensional sub-array of the sensor array 202 (i.e., a P×Q sub-array of the sensor array 202). In FIGS. 2A and 2B, a 3×3 sub-array of the sensor cells 204 forms a read-out cell 234. Some implementations may employ a different sized read-out cell. The control circuit 208 controls formation of the read-out cell by enabling select sensor cells 204 of the sensor array 202 to provide output currents to the current-to-voltage conversion circuit 206. The currents output by the different sensor cells 204 of a row are summed on the conductor connecting the sensor cells 204 to the current-to-voltage conversion circuit 206. For example, given the laser spot 236 shown in FIGS. 2A and 2B, the control circuit 208 closes switch 312 and switch 316 of each of the sensor cell 204-11, the sensor cell 204-12, the sensor cell 204-13, the sensor cell 204-21, the sensor cell 204-22, the sensor cell 204-23, the sensor cell 204-31, the sensor cell 204-32, and the sensor cell 204-33 to provide output of the preamplifier circuit 304 of each the selected sensor cells 204 on the output 216, and provide feedback from the current-to-voltage conversion circuit 206 to the selected sensor cells 204. The control circuit 208 enables, and provides weighting values to, one of the summation circuits 212 to sum the signals produced by the different rows of the read-out cell 234.

In some implementations of the optical sensor circuit 200, the control circuit 208 may also enable output by the sensor cells 204 that are adjacent to the read-out cell 234 for ambient light measurement. For example, given the laser spot 236 shown in FIGS. 2A and 2B, the control circuit 208 may close switch 314 and switch 318 of each of the sensor cell 204-14, the sensor cell 204-24, the sensor cell 204-34 and other sensor cells 204 adjacent to the read-out cell 234 to provide output of the preamplifier circuit 304 of each the selected sensor cells 204 on the output 214, and provide feedback from the current-to-voltage conversion circuit 206 to the selected sensor cells 204. The difference of the signal on the input 218 and the input 220 may be applied to improve noise immunity.

Figure 6:
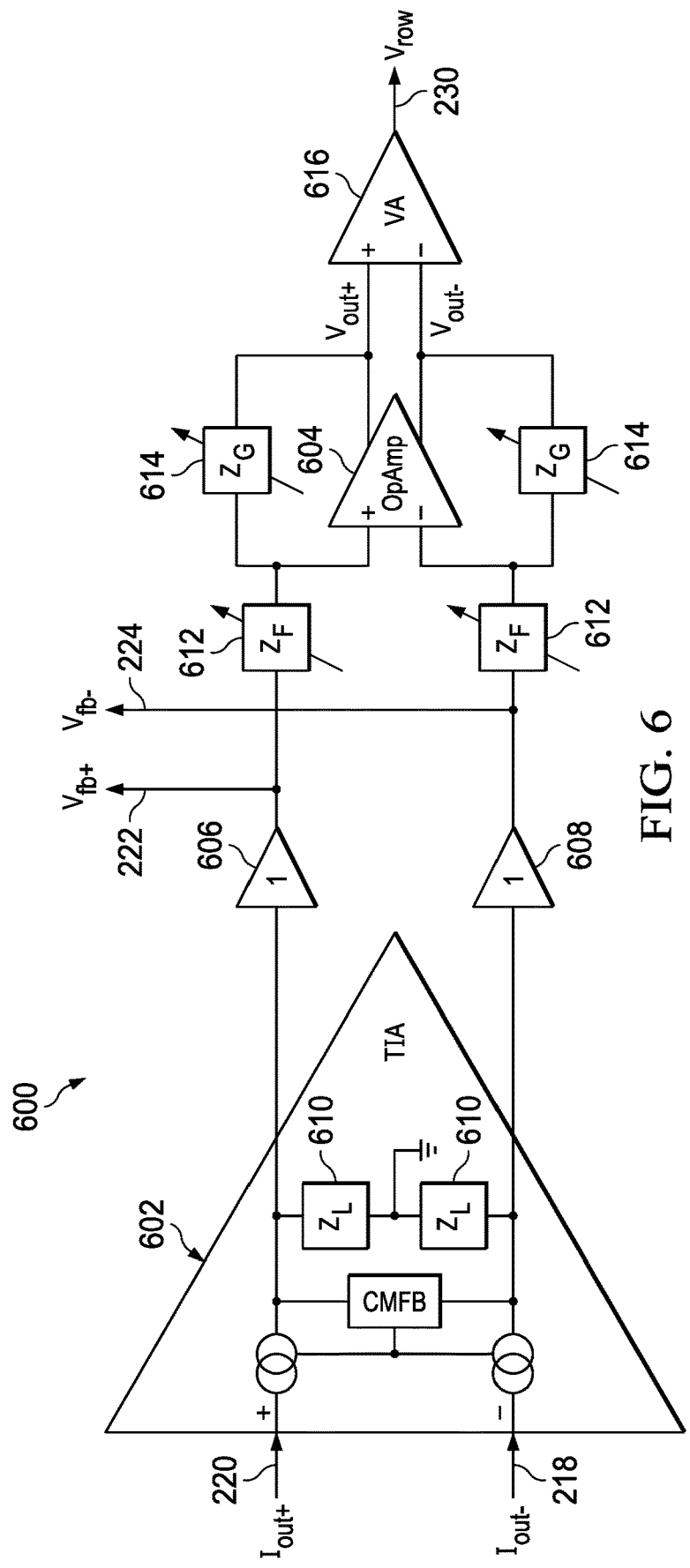
FIGS. 6 and 7 show schematic diagrams for examples of a second stage of a distributed amplifier of an optical sensor array in accordance with this description.

FIG. 6 shows a schematic diagram for an example current-to-voltage converter 600 in accordance with this description. The current-to-voltage converter 600 is an implementation of the current-to-voltage conversion circuit 206. The current-to-voltage converter 600 includes a transimpedance amplifier 602, a differential operational amplifier 604, feedback drivers 606 and 608, and a voltage amplifier 616. The transimpedance amplifier 602 includes inputs that are coupled to the output 214 and the output 216 of the sensor cells 204. The transimpedance amplifier 602 sinks the currents output by the sensor cells 204 that are connected in parallel to the current-to-voltage converter 600. The transimpedance amplifier 602 outputs (and optionally multiplies) the current into an impedance 610 ($Z_L$) for conversion into voltage and signal amplification. The impedance 610 may be a very large resistor or transistor active load in parallel with parasitic capacitance.

The outputs of the transimpedance amplifier 602 are coupled to the feedback driver 606 and the feedback driver 608. The feedback driver 606 and the feedback driver 608 may be unity gain driver circuits. The feedback driver 606 buffers a first output of the transimpedance amplifier 602, and the feedback driver 608 buffers a second output of the transimpedance amplifier 602. The output of the feedback driver 606 is the output 222 that is coupled to the input 228 of the sensor cells 204 for providing feedback to the preamplifier circuit 304 via the global feedback network 310. The output of the feedback driver 608 is output 224 that is coupled to the input 226 of the sensor cells 204 for providing feedback to the preamplifier circuit 304 via the global feedback network 310.

The outputs of the feedback driver 606 and the feedback driver 608 are coupled to the inputs of the differential operational amplifier 604, and the outputs of the differential operational amplifier 604 are coupled to the inputs of the voltage amplifier 616. The output of the voltage amplifier 616 is the output 230. The gain of the transimpedance amplifier 602 will be approximately the impedance of the global feedback network 310 feedback-to-input impedance divided by impedance 612 (ZF) and multiplied by impedance 614 (ZG) assuming the product of current gain and the impedance 610 is very large. The photodiode 302 can be approximated by a sense-dependent current source in parallel with parasitic sensor capacitance. Similarly, the impedance of the global feedback network 310 is approximately dominated by its (parasitic) capacitance. Hence, choosing the impedance 612 to be a capacitor will cause the current flowing through it to be the ratio of these capacitances. Choosing impedance 614 to be a resistor will force the output voltages, $V_{out+}$ and $V_{out-}$, of the differential operational amplifier 604 to be proportional to the sensed current, which is proportional to the measured light over the entire operating frequency range. The two voltage outputs of the transimpedance amplifier 602 are subtracted and multiplied by the voltage amplifier 616.

Figure 7:
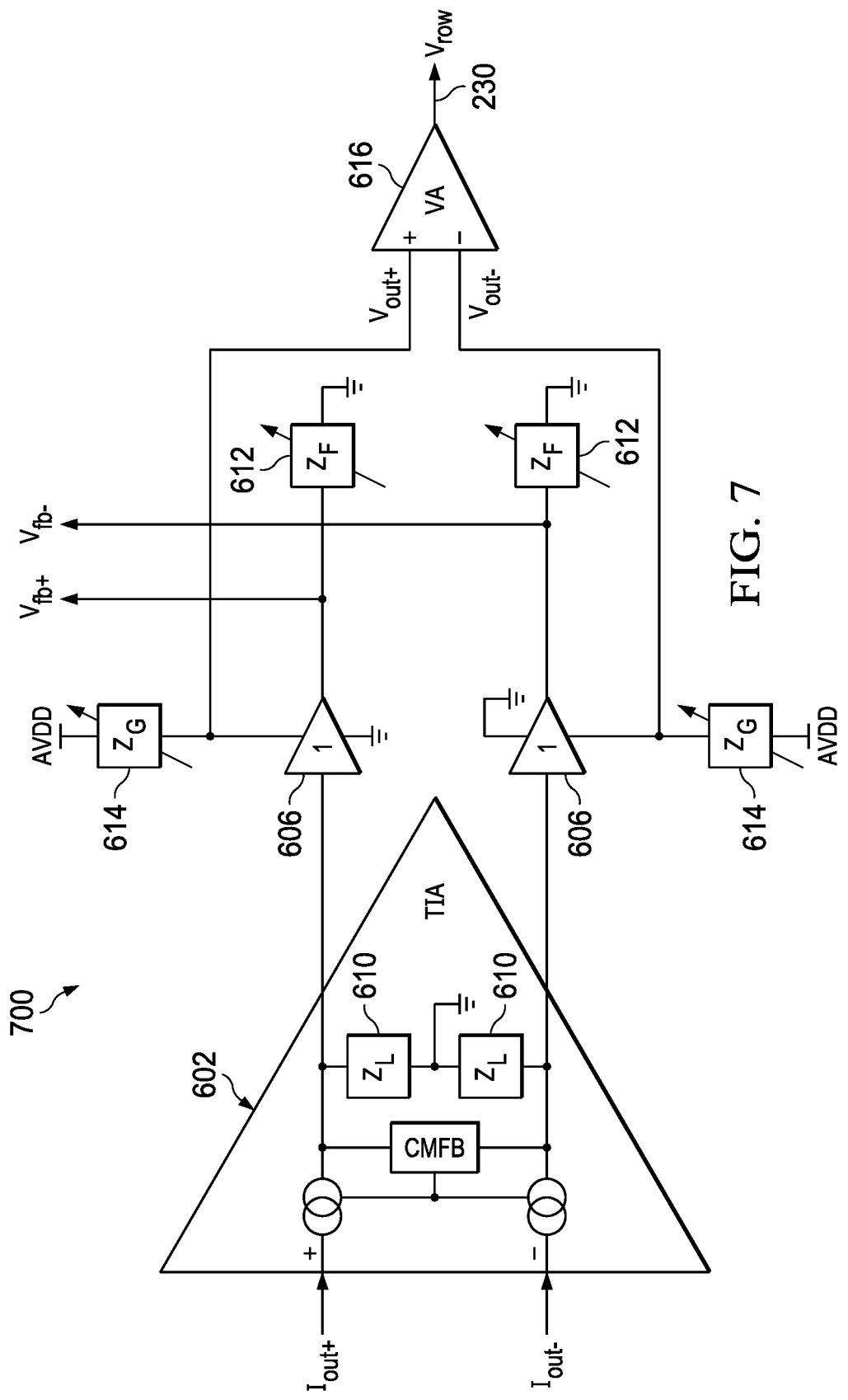

An alternate implementation of the current-to-voltage conversion circuit 206 is shown in FIG. 7 where the feedback drivers 606 directly generate the output voltages, $V_{out+}$ and $V_{out-}$, by drawing their (AC) output currents from an AVDD power line through the impedance 614, which again is typically chosen to be a resistor. The impedance 612 can be coarsely tuned for stability while impedance 614 is tuned for gain adjustment. Additional control signals from the control circuit 208 or a signal-sensing path within the TIA are not shown for simplicity.

Figure 8:
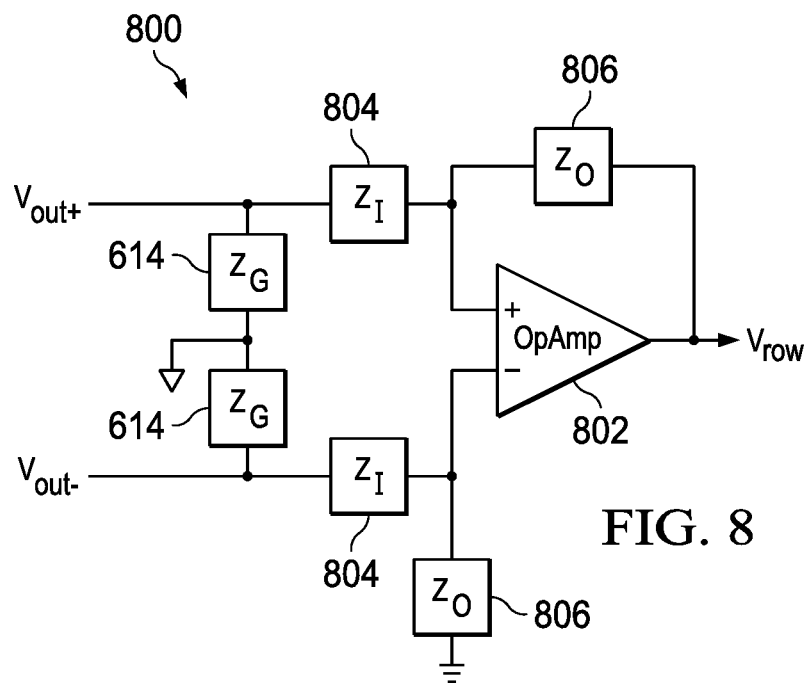
FIG. 8 shows a block diagram for an example voltage amplifier in accordance with this description.
Figure 9:
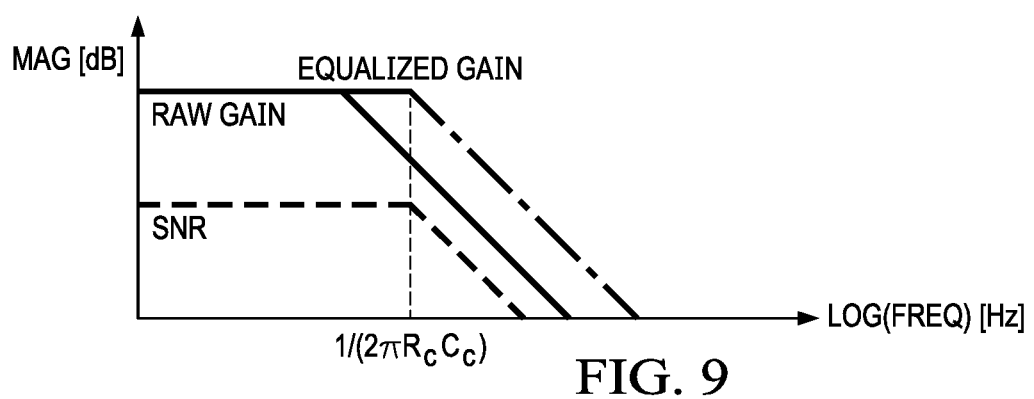
FIG. 9 shows a graph of gain and signal-to-noise ratio versus frequency for a voltage amplifier in accordance with this description.

FIG. 8 shows a block diagram for an example voltage amplifier 800 in accordance with this description. The voltage amplifier 800 is an implementation of the voltage amplifier 616. The voltage amplifier 800 includes an operational amplifier 802, input impedances 804, and output impedances 806. The gain of the voltage amplifier 800 may have a low-pass frequency response where the gain drops at higher frequencies as shown in FIG. 9. However, due to the spatially distributed low noise amplifier structure and the use of the preamplifier circuit 304 with the photodiode 302, the signal-to-noise ratio (SNR) will not degrade over the desired operating frequency. Thus, it is possible to compensate for the gain degradation using an equalizer circuit as show in FIG. 10.

Figure 10:
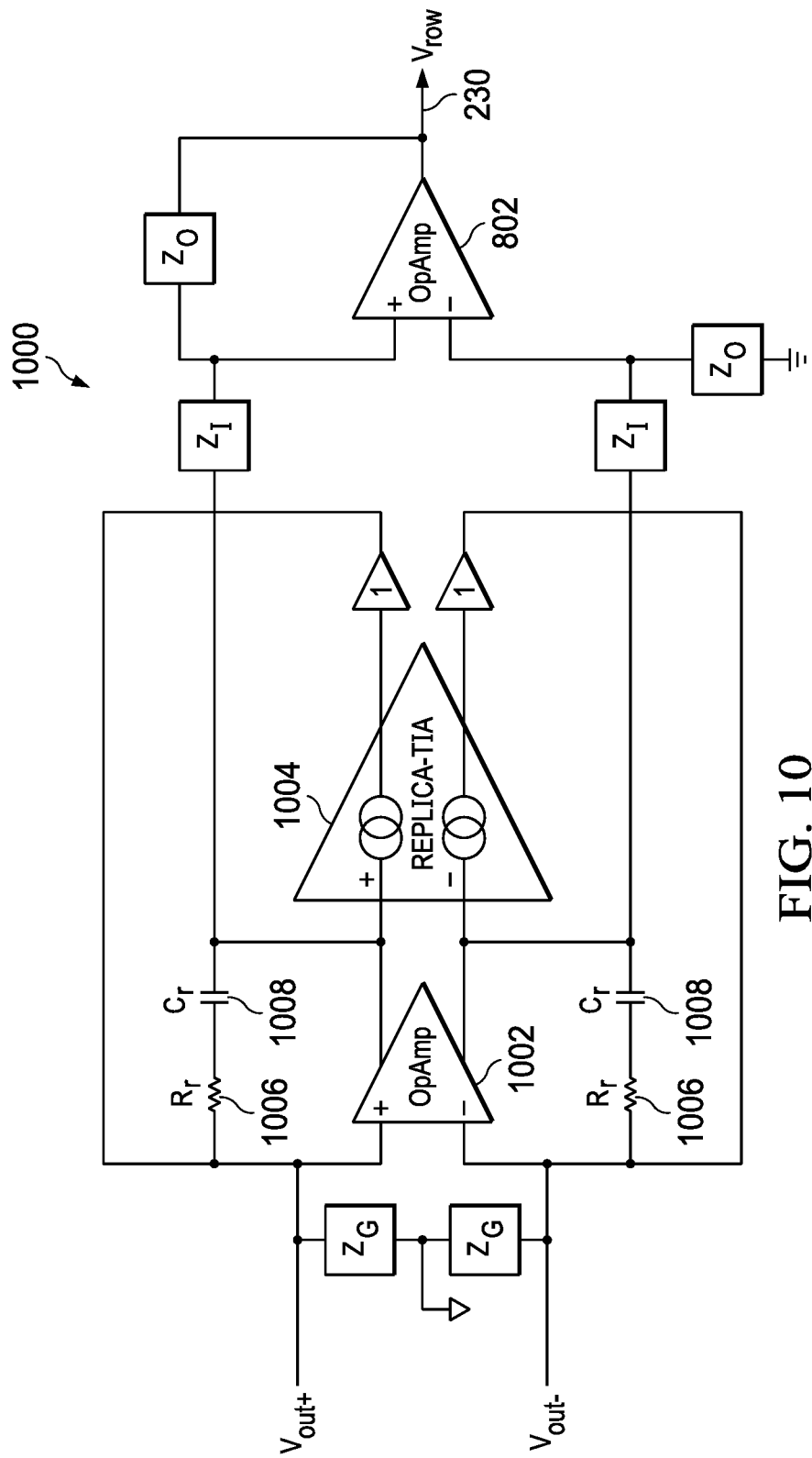
FIG. 10 shows a schematic diagram for an example voltage amplifier that includes an equalizer in accordance with this description.

The voltage amplifier 1000 shown in FIG. 10 includes the operational amplifier 802 and a replica-transimpedance amplifier (TIA) 1004 in the feedback path of an intermediary differential operational amplifier 1002. The replica-TIA 1004 will exhibit a gain-degradation profile that is very similar to that of the transimpedance amplifier 602, and when placed in the feedback path of the intermediary differential operational amplifier 1002, forces the intermediary differential operational amplifier 1002 to compensate for the degradation. An auxiliary feedback path including series resistors 1006 and capacitors 1008 ensures the compensation is applied only up to the desired bandwidth, providing stability and avoiding noise amplification at higher frequencies. After the intermediary differential operational amplifier 1002 equalizes the gain, the operational amplifier 802 applies a subtract-and-multiply operation to generate a final, single voltage output for the row.

Figure 11A:
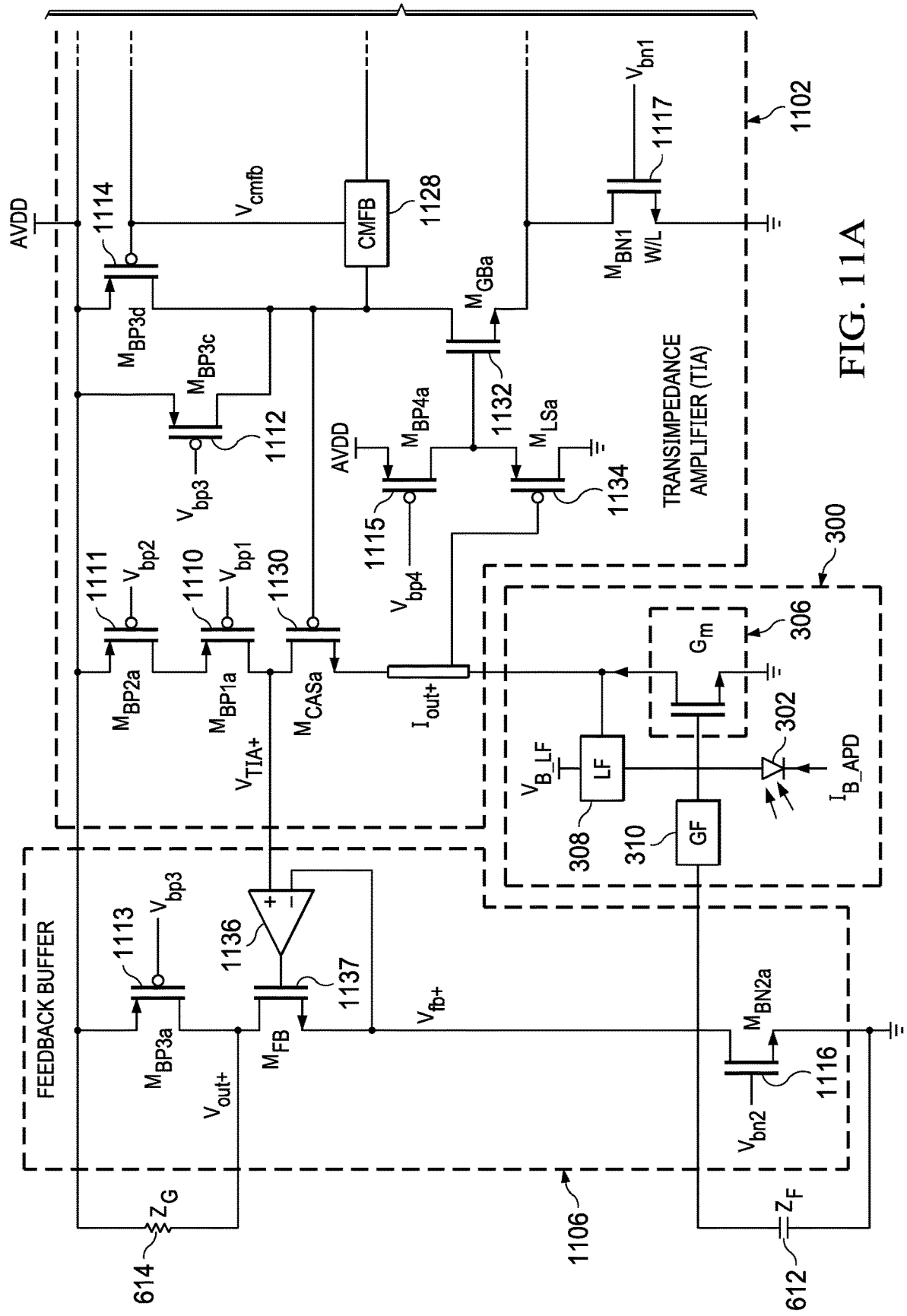
FIGS. 11A and 11B show a schematic diagram for an example transimpedance amplifier and feedback driver in accordance with this description.
Figure 11B:
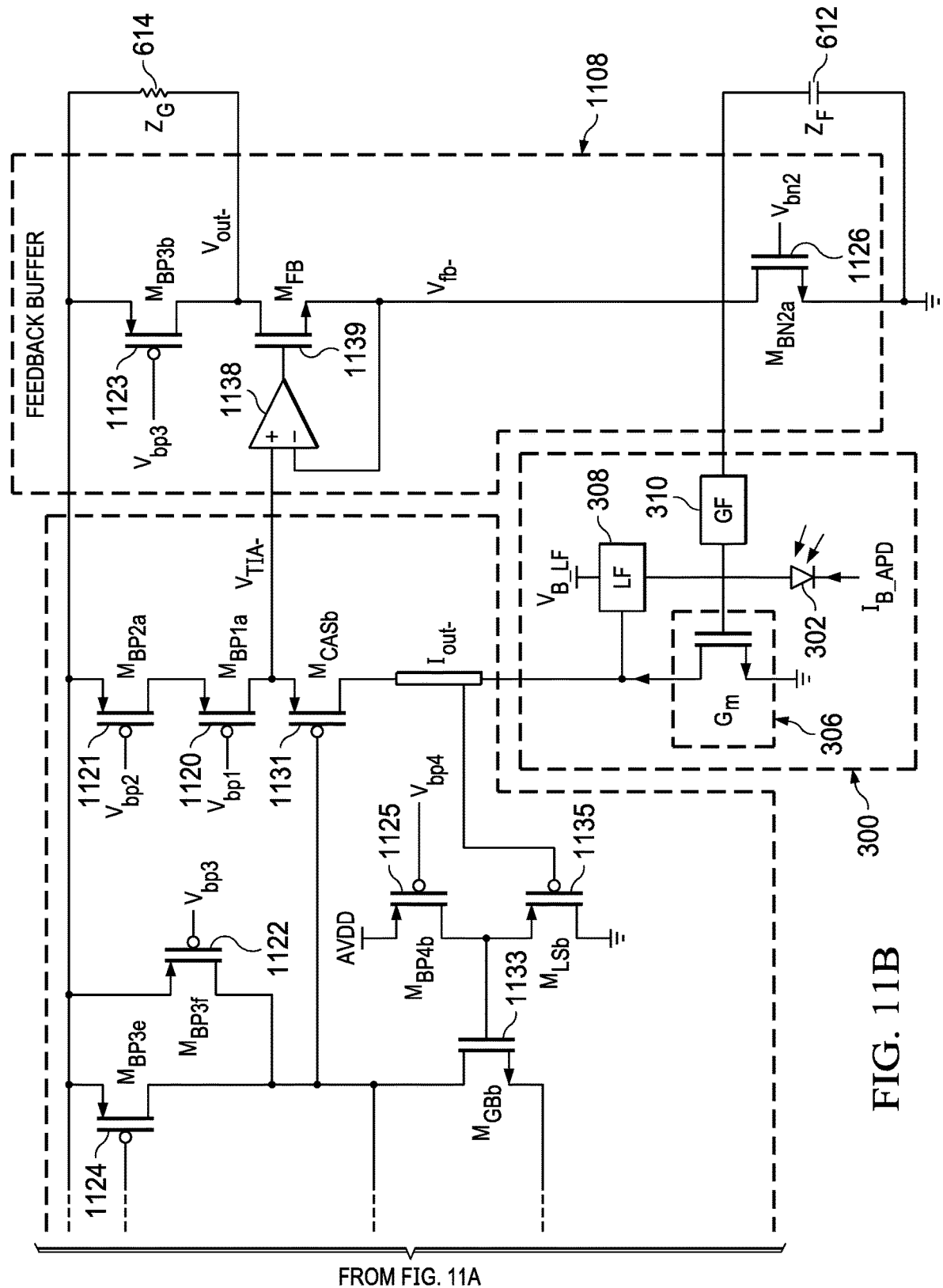

FIGS. 11A and 11B shows a schematic diagram for an example transimpedance amplifier 1102, feedback driver 1106, and feedback driver 1108 in accordance with this description. The transimpedance amplifier 1102, the feedback driver 1106, and the feedback driver 1108 are implementations of the transimpedance amplifier 602, the feedback driver 606, and feedback driver 608 respectively. In the circuit of FIGS. 11A and 11B, the transistors 1110, 1111, 1112, 1113, 1114, 1115, 1116, 1117, 1120, 1121, 1122, 1123, 1124, 1125, and 1126 act as DC current sources that power and bring the circuit into operation. At AC operating frequencies, these transistors act as very large resistors with some parallel parasitic capacitance. The transistors 1130 and 1131 operate as cascode devices, and the transistors 1132 and 1133 operate as gain-boosting devices. The transistors 1134 and 1135 operate as level shifting devices. In the feedback driver 1106, the transistor 1137 and the operational amplifier 1136 buffer the output $V_{fb+}$. In the feedback driver 1108, the transistor 1139 and the operational amplifier 1138 buffer the output $V_{fb-}$.

Figure 12:
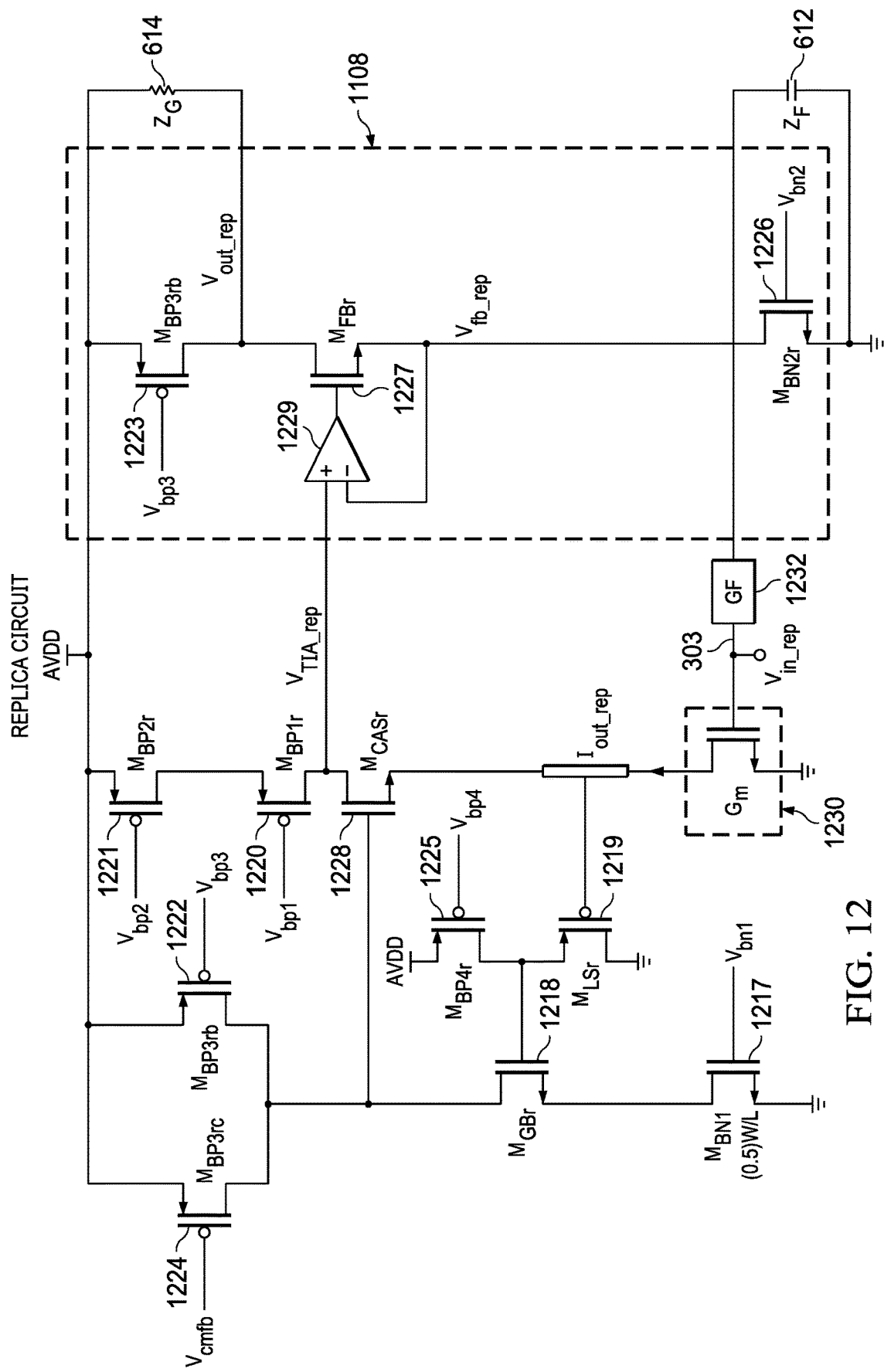
FIG. 12 shows a schematic diagram for an example transimpedance amplifier replica circuit in accordance with this description.

To simplify the analysis of the circuit in FIGS. 11A and 11B, the half-circuit can be considered. The half-circuit of the circuit 1100 is similar to the replica circuit 1200 shown in FIG. 12 except the source of transistor 1218 would be virtual ground and the local feedback network 308 would be present. The replica-circuit 1200 is an implementation of the replica-TIA 1004. In this analysis, the photodiode 302 injects an AC input current into the circuit 1200, proportional to the incident light. This current ultimately flows through the global feedback network 310 due to the feedback action; however, it also is converted into a voltage at the input node 303. The voltage engages the transconductor 306, to generate an output current that is merged onto the $I_{out+}$ line. Next the cascode device, transistor 1228, together with the gain-boosting device 1218, operate as a regulated cascode (RGC) which presents a very small impedance on the $I_{out+}$ line, drawing in all currents merged onto this line by one or more sensor cells 204. This benefit is a noteworthy feature, as the $I_{out+}$ line may be connected to many sensors that generate significant parasitic capacitance, which would otherwise drain these currents. The level-shifting device, transistor 1219, ensures that the DC operation of the transistor 1218 has sufficient voltage margin over temperature and process variations. The transistor 1218, in conjunction with the local feedback network 308, ensures that the transistor 1228 remains at the same DC operating point irrespective of any DC current leakage from the optical sensor cell 300 (due to, for example, ambient light or dark current).

Current drawn in by the RGC from the $I_{out+}$ line is injected into a high impedance 610 and is converted into a large voltage, $V_{TIA+}$. This voltage is fed into the feedback buffer, transistor 1227, to drive the $V_{fb+}$ line with a low output impedance. The transistor $V_{fb+}$ line is connected to the capacitor 612 and the global feedback network 310. The 1227 may be bootstrapped, with the operational amplifier 1229 ensuring that the buffer output impedance is low, even under the circumstances where the DC bias current through the transistor 1227 is kept small to ensure large current source impedance and low noise contribution. Since the global feedback network 310 and the local feedback network 308 are dominated by capacitance (in AC), the sensor input current is split between two paths: (1) the global feedback network 310 and (2) parasitic capacitance associated with the sensor 302, the transconductor 306, and the local feedback network 308. The feedback action ensures the global feedback network 310 is a larger effective capacitance than the parasitic capacitances at the input node 303. This benefit is achieved through large, inverted voltage swings on $V_{fb+}$ when the voltage at the input node 303 changes slightly due to the input current. Hence, the sensor current prefers the effective low impedance path through the global feedback network 310. Additionally, the impedance 612 is a large capacitor and thus low impedance. Hence, generation of large voltage swings on the $V_{fb+}$ line requires proportionally large driving currents that are drawn through the impedance 614. Since these currents are effectively proportional to the input current, the final output voltage on the impedance 614, $V_{out+}$, is proportional to the sensor input current but with a large gain given by:

$$\frac{V_{out}}{I_{in}} = \frac{2\pi f \cdot capacitance\{Z_F\}}{2\pi f \cdot capacitance\{GF\}} Z_G = Z_G \to R_G$$

where GF is the global feedback network 310.

The impact of circuit noise on the final signal-to-noise ratio is minimized by reducing the size and DC bias current of the transistor 1226 and increasing the size and DC bias current of the transconductor 306 while still consuming a small fraction of the area of the sensor cell 204.

Figure 13:
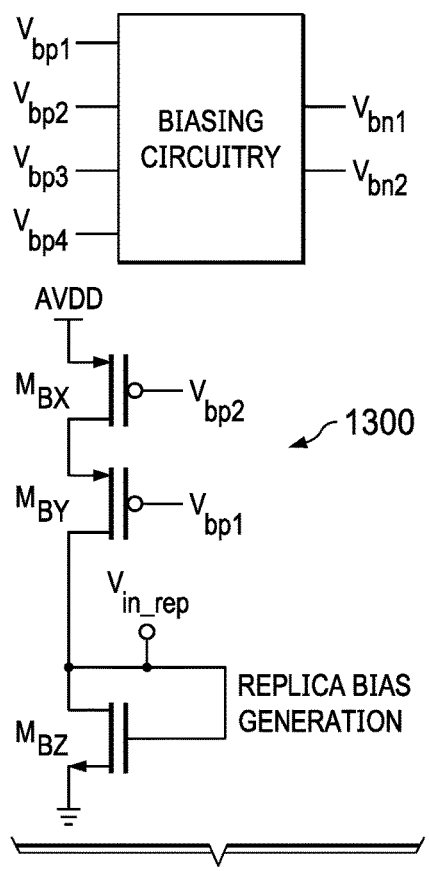
FIG. 13 shows a schematic diagram for an example bias voltage generation circuit suitable for use with implementations of this description.
Figure 14:
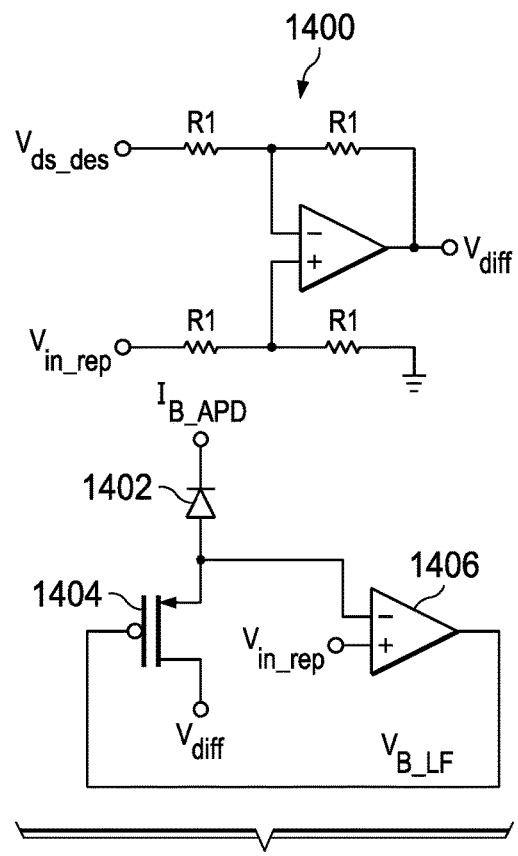
FIG. 14 shows a schematic diagram for an example temperature compensation circuit suitable for use in implementations of this description.

In the transimpedance amplifier 1102, the common-mode feedback (CMFB) circuit 1128 ensures proper biasing at the gate of the transistor 1130 and the transistor 1131, by setting the bias voltage to the nominal value generated by the replica circuit 1200. In the replica circuit 1200, the current sources and the input bias voltage, $V_{in\_rep}$, generated by the circuit 1300, shown in FIG. 13, initiate a cascade of bias voltage generation through DC feedback. First, the replica transconductor 1230 sets the replica transistor 1219 gate bias voltage, which sets the replica transistor 1218 gate bias voltage, which then sets the replica transistor 1228 gate bias voltage, which finally sets the replica transistor 1227 gate bias voltage. Any error from the nominal bias voltages propagates through the cascade and is feedback to the input bias node through the replica global feedback network 1232 for correction. Thus, when the transistor 1128 enforces the same gate bias voltage on the transistor 1130 and the transistor 1131 of the transimpedance amplifier 1102 as that from the replica transistor 1228 in the replica circuit 1200, the rest of transimpedance amplifier 1102 obtains similar nominal and correct biasing. This approach relies on good matching between the transimpedance amplifier 1102 and the replica circuit 1200, which can be achieved by placing the circuits in close proximity and using good layout techniques such as transistor inter-digitation. However, the global feedback network 310 and the transconductor 306 in the 1100 are generally located far away from the circuit within the sensor cell 204 so additional compensation for process and temperature variations must be applied with the help of the local feedback network 308 in the sensor cell 204 and the temperature compensation circuit 1400 shown in FIG. 14.

In the local feedback network 308, the transistor 406 connecting the output and the input of the local feedback network 308 acts as a large MOS-resistor with AC, leaving the signal chain undisturbed, but is capable of channeling extra DC leakage current from the photodiode 302 to the output for drainage. The transistor 406 also acts to self-bias the transistor 402 and compensate for any mismatch. However, the transistor 406 itself requires biasing, which is provided by the example circuit 1400. The circuit 1400 may be included in the bias circuit 238. In the circuit 1400, a replica sensor 1402 and MOS-resistor 1404 are used to generate the biasing voltage, $V_{B\_LF}$. The replica sensor 1402 receives the same ambient signals and temperature effects as the main sensors 303; hence it produces the same DC leakage current. The sensor-side terminal of the MOS-resistor 1404 is nominally at $V_{in\_rep}$, as set by the circuit 1300. To ensure a large resistance value, a nominal desired drain-source voltage, $V_{ds\_des}$, such as 200 mV is used as a reference. This voltage can be obtained from conventional band-gap voltage reference circuits, not shown here for brevity. Subtracting $V_{ds\_des}$ from $V_{in\_rep}$ would result in the proper drain voltage on the pseudo-resistor, $V_{diff}$. The circuit 1400 adjusts $V_{B\_LF}$, such that all the leakage current from the replica sensor 1402 is drained as is done by the feedback action of the op-amp 1406.

Figure 15:
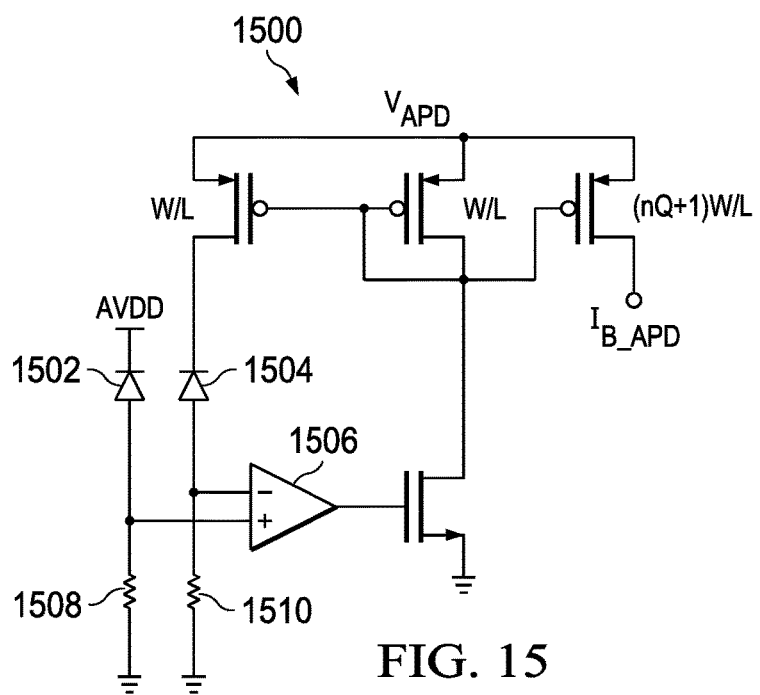
FIG. 15 shows a schematic diagram for an example avalanche photodiode bias circuit suitable for use in implementations of this description.

Some implementations of the photodiode 302, such as avalanche photodiodes (APDs), have a temperature-sensitive gain profile, especially at large gain values. The example bias circuit 1500, shown in FIG. 15, demonstrates a compensation mechanism to achieve consistent gain from APDs over temperature variation. The circuit 1500 may be included in the bias circuit 238. The circuit 1500 includes two replica sensor APDs 1502 and 1504. The APD 1502 is biased with a low reverse voltage (e.g. AVDD) to achieve unity gain and is connected to the "+" terminal of an operational amplifier 1506 with shunt resistor 1508 having resistance R. The temperature-dependent current generates a reference voltage at this terminal. The op-amp feedback action enforces the same voltage on the "−" terminal using a shunt resistor 1510 having resistance of R/MAPD, the current through the APD 1504 is set to MAPDX larger than the reference. This design has the same effect of setting the APD 1504 to have MAPDX the gain of the reference via the generated bias current flowing through the APD 1504. This current can then be mirrored to and multiplied by (nxQ+1) onto the $I_{B\_APD}$ line to provide bias current to Q additional sensor cells 204 in the given row plus one replica sensor 1402 of that row. Here, n=2 if a difference is taken with an adjacent reference readout cell (e.g. +/− mode) and n=1 otherwise. When temperature changes occur, $I_{B\_APD}$ automatically adjusts to track the changes and this reflects on $V_{B\_LF}$ which biases the local feedback network 308. This design might, however, require high-voltage devices in the circuit 1400. Finally, to ensure practical current mirroring ratios, the APD 1502 and the APD 1504 may be scaled up by several units.

Modifications are possible in the described embodiments, and other embodiments are possible, within the scope of the claims.

What is claimed is:

1. A sensor circuit, comprising:
    a sensor array, comprising a sensor row, the sensor row including:
        a first sensor cell comprising:
            a first photodetector; and
            a first preamplifier stage of a distributed amplifier circuit, the first preamplifier stage coupled to the first photodetector, and configured to amplify a signal received from the first photodetector;
        a second sensor cell comprising:
            a second photodetector; and
            a second preamplifier stage of the distributed amplifier circuit, the second preamplifier stage coupled to the second photodetector, and configured to amplify a signal received from the second photodetector; and
        an output stage of the distributed amplifier circuit, the output stage coupled to the first sensor cell and the second sensor cell, and configured to amplify a signal received from the first preamplifier stage and the second preamplifier stage;
    in which the first sensor cell comprises a feedback network coupled between an input of the first preamplifier stage and an output of the output stage.

2. The sensor circuit of claim 1, wherein the feedback network is a first feedback network, and the first sensor cell comprises a second feedback network coupled between the input of the first preamplifier stage and to an output of the first preamplifier stage.

3. The sensor circuit of claim 1, wherein the first sensor cell comprises:
    a first switch configured to selectively connect an input of the feedback network to a first output of the output stage; and
    a second switch configured to selectively connect the input of the feedback network to a second output of the output stage.

4. The sensor circuit of claim 1, wherein the photodetector is an avalanche photodiode.

5. A sensor circuit, comprising:
    a sensor array, comprising a sensor row, the sensor row including:
        a first sensor cell comprising:
            a first photodetector; and
            a first preamplifier stage of a distributed amplifier circuit, the first preamplifier stage coupled to the first photodetector, and configured to amplify a signal received from the first photodetector;

a second sensor cell comprising:
a second photodetector; and
a second preamplifier stage of the distributed amplifier circuit, the second preamplifier stage coupled to the second photodetector, and configured to amplify a signal received from the second photodetector; and
an output stage of the distributed amplifier circuit, the output stage coupled to the first sensor cell and the second sensor cell, and configured to amplify a signal received from the first preamplifier stage and the second preamplifier stage, and the output stage comprising:
a transimpedance amplifier coupled to the first sensor cell and the second sensor cell; and
a voltage amplifier coupled to an output of the transimpedance amplifier.

6. The sensor circuit of claim 5, wherein the output stage comprises driver circuitry coupled to the output of the transimpedance amplifier, the first sensor cell, and the second sensor cell.

7. A sensor circuit, comprising:
a sensor array, comprising a sensor row, the sensor row including:
a first sensor cell comprising:
a first photodetector; and
a first preamplifier stage of a distributed amplifier circuit, the first preamplifier stage coupled to the first photodetector, and configured to amplify a signal received from the first photodetector;
a second sensor cell comprising:
a second photodetector; and
a second preamplifier stage of the distributed amplifier circuit, the second preamplifier stage coupled to the second photodetector, and configured to amplify a signal received from the second photodetector; and
an output stage of the distributed amplifier circuit, the output stage coupled to the first sensor cell and the second sensor cell, and configured to amplify a signal received from the first preamplifier stage and the second preamplifier stage;
in which the first sensor cell comprises:
a first switch configured to selectively connect an output of the first preamplifier stage to a first input of the output stage; and
a second switch configured to selectively connect the output of the first preamplifier stage to a second input of the output stage.

8. A sensor circuit, comprising:
a sensor array, comprising first and second sensor rows, the first sensor row including:
a first sensor cell comprising:
a first photodetector; and
a first preamplifier stage of a distributed amplifier circuit, the first preamplifier stage coupled to the first photodetector, and configured to amplify a signal received from the first photodetector;
a second sensor cell comprising:
a second photodetector; and
a second preamplifier stage of the distributed amplifier circuit, the second preamplifier stage coupled to the second photodetector, and configured to amplify a signal received from the second photodetector; and
an output stage of the distributed amplifier circuit, the output stage coupled to the first sensor cell and the second sensor cell, and configured to amplify a signal received from the first preamplifier stage and the second preamplifier stage; and
a summation circuit coupled to the first sensor row and the second sensor row, and configured to sum a first signal output by the first sensor row and a second signal output by the second sensor row.

9. The sensor circuit of claim 8, wherein:
the summation circuit is a first summation circuit; and
the sensor circuit comprises:
a second summation circuit coupled to the first sensor row and the second sensor row, and configured to sum a first signal output by the first sensor row and a second signal output by the second sensor row; and
a multiplexer circuit coupled to the first summation circuit and the second summation circuit, and configured to selectably route outputs of the first summation circuit and the second summation circuit to outputs of the sensor circuit.

10. The sensor circuit of claim 9, further comprising a control circuit coupled to the first sensor cell, the second sensor cell, the first summation circuit, the second summation circuit, and the multiplexer circuit, the control circuit configured to:
control output switching of the first preamplifier stage and the second preamplifier stage;
control switching of feedback from the output stage to the first preamplifier stage and the second preamplifier stage;
provide summation weight values to the first summation circuit and the second summation circuit; and
control routing of the outputs of the first summation circuit and the second summation circuit by the multiplexer.

11. An optical scanning system, comprising:
a sensor circuit, comprising:
a sensor array comprising a row of sensor cells, the row of sensor cells including:
a first sensor cell comprising:
a first photodetector;
a first preamplifier stage of a distributed amplifier circuit, the first preamplifier stage coupled to the first photodetector, and configured to amplify a signal received from the first photodetector; and
a first feedback network coupled to an input of the first preamplifier stage;
a second sensor cell comprising:
a second photodetector; and
a second preamplifier stage of the distributed amplifier circuit, the second preamplifier stage coupled to the second photodetector, and configured to amplify a signal received from the second photodetector; and
a second feedback network coupled to an input of the second preamplifier stage; and
an output stage of the distributed amplifier circuit, the output stage coupled to the first sensor cell and the second sensor cell, and configured to:
amplify a signal received from the first preamplifier stage and the second preamplifier stage; and
provide a feedback signal to the first feedback network and the second feedback network.

12. The optical scanning system of claim 11, wherein:
the first sensor cell comprises a third feedback network coupled between the input of the first preamplifier stage and an output of the first preamplifier stage; and the second sensor cell comprises a fourth feedback network coupled between the input of the second preamplifier stage and an output of the second preamplifier stage.

13. The optical scanning system of claim 11, wherein the output stage comprises:
   a transimpedance amplifier coupled to the first sensor cell and the second sensor cell;
   a voltage amplifier coupled to an output of the transimpedance amplifier; and
   driver circuitry configured to provide the output of the transimpedance amplifier to the first feedback network and the second feedback network.

14. The optical scanning system of claim 11, wherein:
   the row of sensor cells is a first row of sensor cells;
   the sensor array comprises a second row of sensor cells; and
   the sensor circuit comprises:
      a first summation circuit coupled to the first row of sensor cells and the second row of sensor cells, and configured to sum a first signal output by the first row of sensor cells and a second signal output by the second row of sensor cells;
      a second summation circuit coupled to the first row of sensor cells and the second row of sensor cells, and configured to sum the first signal output by the first row of sensor cells and the second signal output by the second row of sensor cells; and
      a multiplexer circuit coupled to the first summation circuit and the second summation circuit, and configured to selectably route outputs of the first summation circuit and the second summation circuit to outputs of the sensor circuit.

15. The optical scanning system of claim 14, wherein the sensor circuit comprises a control circuit coupled to the first sensor cell, the second sensor cell, the first summation circuit, the second summation circuit, and the multiplexer circuit, the control circuit configured to:
   control output switching of the first preamplifier stage and the second preamplifier stage;
   control switching of feedback from the output stage to the first preamplifier stage and the second preamplifier stage;
   provide summation weight values to the first summation circuit and the second summation circuit; and
   control routing of the outputs of the first summation circuit and the second summation circuit by the multiplexer.

16. The optical scanning system of claim 11, further comprising:
   an optical source configured to generates an optical signal; and
   a lens configured to focus a reflection of the optical signal on the sensor array.

17. A sensor circuit, comprising:
a sensor array comprising a sensor row, the sensor row including:
   a first sensor cell comprising:
      a first photodiode; and
      a first preamplifier stage of a distributed amplifier circuit, comprising:
         a first preamplifier coupled to the first photodiode, the first preamplifier comprising:
            a first transconductance amplifier; and
            a first local feedback network coupled between an input of the first transconductance amplifier and an output of the first transconductance amplifier; and
         a first global feedback network coupled to the input of the first transconductance amplifier;
   a second sensor cell comprising:
      a second photodiode; and
      a second preamplifier stage of a distributed amplifier circuit, comprising:
         a second preamplifier coupled to the second photodiode, the second preamplifier comprising:
            a second transconductance amplifier; and
            a second local feedback network coupled between an input of the second transconductance amplifier and output of the second transconductance amplifier; and
         a second global feedback network coupled to an input of the second transconductance amplifier; and
   an output stage of the distributed amplifier circuit, the output stage coupled to the first sensor cell and the second sensor cell, and comprising:
      a transimpedance amplifier coupled to an output of the first transconductance amplifier and an output of the second transconductance amplifier;
      a voltage amplifier coupled to an output of the transimpedance amplifier; and
      driver circuitry coupled to the output of the transimpedance amplifier, to an input of the first global feedback network, and to an input of the second global feedback network.

18. The sensor circuit of claim 17, wherein the first sensor cell comprises:
   a first switch configured to selectively connect the input of the first global feedback network to a first output of the transimpedance amplifier;
   a second switch configured to selectively connect the input of the first global feedback network to a second output of the transimpedance amplifier;
   a third switch configured to selectively connect the output of the first transconductance amplifier to a first input of the transimpedance amplifier; and
   a fourth switch configured to selectively connect the output of the first transconductance amplifier to a second input of the transimpedance amplifier.

19. The sensor circuit of claim 17, further comprising:
   a plurality of summation circuits coupled to the sensor row;
   a multiplexer circuit coupled to the plurality of summation circuits; and
   control circuitry coupled to the first sensor cell, the second sensor cell, the plurality of summation circuits, and the multiplexer circuit.

* * * * *